(12) United States Patent
Fang et al.

(10) Patent No.: US 10,288,215 B2
(45) Date of Patent: May 14, 2019

(54) FIXING SUPPORT FOR HORIZONTAL AND VERTICAL USE

(71) Applicants: BOE TECHNOLOGY GROUP CO., LTD., Beijing (CN); BEIJING BOE MULTIMEDIA TECHNOLOGY CO., LTD., Beijing (CN)

(72) Inventors: Deli Fang, Beijing (CN); Huijun Li, Beijing (CN); Yansheng Sun, Beijing (CN)

(73) Assignees: BOE TECHNOLOGY GROUP CO., LTD., Beijing (CN); BEIJING BOE MULTIMEDIA TECHNOLOGY CO., LTD., Beijing (CN)

( * ) Notice: Subject to any disclaimer, the term of this patent is extended or adjusted under 35 U.S.C. 154(b) by 10 days.

(21) Appl. No.: 15/535,907

(22) PCT Filed: Nov. 8, 2016

(86) PCT No.: PCT/CN2016/104980
§ 371 (c)(1),
(2) Date: Jun. 14, 2017

(87) PCT Pub. No.: WO2017/177669
PCT Pub. Date: Oct. 19, 2017

(65) Prior Publication Data
US 2018/0202600 A1    Jul. 19, 2018

(30) Foreign Application Priority Data

Apr. 15, 2016  (CN) .......................... 2016 1 0237224

(51) Int. Cl.
*F16M 11/04*      (2006.01)
*F16M 11/10*      (2006.01)
(Continued)

(52) U.S. Cl.
CPC ........... *F16M 11/105* (2013.01); *F16M 11/04* (2013.01); *F16M 11/06* (2013.01);
(Continued)

(58) Field of Classification Search
CPC ...... F16M 11/105; F16M 11/06; F16M 11/08; F16M 11/10; F16M 11/12; F16M 11/14;
(Continued)

(56) References Cited

U.S. PATENT DOCUMENTS 2,042,760 A * 6/1936 Baas .......................... G09F 3/08
248/454
2,775,424 A * 12/1956 Harris ....................... A47F 5/12
248/454

(Continued)

FOREIGN PATENT DOCUMENTS

CN    201916667 U    8/2011
CN    201944501 U    8/2011
(Continued)

OTHER PUBLICATIONS

International Search Report and Written Opinion dated Feb. 8, 2017; PCT/CN2016/104980.
(Continued)

*Primary Examiner* — Nkeisha Smith
(74) *Attorney, Agent, or Firm* — Ladas & Parry LLP; Loren K. Thompson (57) ABSTRACT

A fixing support for horizontal and vertical use includes a backboard, a support shaft and a locating piece. The support shaft is configured to support the backboard, the backboard has a long side and a short side, and the locating piece is configured to connect the support shaft and the backboard, so that the support shaft is able to secure and support the backboard so as to realize a horizontal-vertical switch.

17 Claims, 6 Drawing Sheets

(51) Int. Cl.
*F16M 11/06* (2006.01)
*F16M 11/12* (2006.01)
*F16M 11/18* (2006.01)
*F16M 11/16* (2006.01)
*H05K 5/00* (2006.01)
*H05K 5/02* (2006.01)

(52) U.S. Cl.
CPC .............. *F16M 11/12* (2013.01); *F16M 11/16* (2013.01); *F16M 11/18* (2013.01); *H05K 5/0017* (2013.01); *H05K 5/0086* (2013.01); *H05K 5/0234* (2013.01); *F16M 2200/024* (2013.01)

(58) Field of Classification Search
CPC .............. F16M 11/16; F16M 11/123; F16M 2200/024; F16M 11/18; H05K 5/0017; H05K 5/0086; H05K 5/0234
USPC .............. 248/458, 454, 455, 444
See application file for complete search history.

(56) References Cited

U.S. PATENT DOCUMENTS

| | | | | |
|---|---|---|---|---|
| 3,825,301 | A * | 7/1974 | Schwarz | A47C 7/38 297/408 |
| 3,957,241 | A * | 5/1976 | Morris | A47K 10/12 248/288.31 |
| 4,036,462 | A * | 7/1977 | Sheftel | G10G 5/00 211/203 |
| 4,516,867 | A * | 5/1985 | Schacht | B41J 3/38 400/134 |
| 4,864,924 | A * | 9/1989 | Storace | B41K 3/10 101/110 |
| 5,499,560 | A * | 3/1996 | Aeschliman | B25B 13/463 81/177.2 |
| 5,502,907 | A * | 4/1996 | Wang | A47G 1/14 248/455 |
| 5,593,040 | A * | 1/1997 | Shelton | B23K 3/087 108/55.3 |
| 5,690,309 | A * | 11/1997 | Blum | A47B 23/041 248/444 |
| 5,709,365 | A * | 1/1998 | Howard | A47B 23/025 248/447.2 |
| 2005/0237425 | A1 | 10/2005 | Lee et al. | |
| 2007/0062089 | A1 | 3/2007 | Homer et al. | |
| 2007/0275629 | A1 | 11/2007 | Tseng | |
| 2010/0012809 | A1 | 1/2010 | Zeng et al. | |

FOREIGN PATENT DOCUMENTS

| | | |
|---|---|---|
| CN | 202109169 U | 1/2012 |
| CN | 203258329 U | 10/2013 |
| CN | 104108402 A | 10/2014 |
| CN | 203979799 U | 12/2014 |
| CN | 104461137 A | 3/2015 |
| CN | 105320221 A | 2/2016 |
| CN | 205160610 U | 4/2016 |
| CN | 105805502 A | 7/2016 |

OTHER PUBLICATIONS

The Second Chinese Office Action dated Nov. 16, 2017; Appln. No. 201610237224.3.
The First Chinese Office Action dated Jul. 25, 2017; Appln. No. 201610237224.3.

* cited by examiner

FIXING SUPPORT FOR HORIZONTAL AND VERTICAL USE

TECHNICAL FIELD

Embodiments of the present disclosure relate to a fixing support for a display.

BACKGROUND

With the rapid development in the field of liquid crystal display, the electronic products, such as the digital photo frame, the tablet PC and the like are getting increasingly popular, and electronic devices such as gravity sensors are also widely used in such electronic products, and thus it is necessary to provide a fixing support structure capable of quickly and conveniently achieving a switch between a horizontal screen and a vertical screen. In the meantime, a photo always exist in two forms, i.e., a horizontal form and a vertical form, however, the traditional photo frame for placing the photo has only one form. Chinese utility model No. 201120228049.4 discloses a photo frame for storing a photo for horizontal and vertical use, the photo frame uses two corner sides, perpendicular to each other, of a support plate to enable the photo frame to stand in two directions. However, the way that the support plate is obliquely disposed behind the photo frame is not steady.

SUMMARY

At least one embodiment of the disclosure provides a fixing support which includes a backboard, a support shaft and a locating piece, the support shaft is configured to support the backboard, the backboard has a long side and a short side, and the locating piece is configured to connect the support shaft and the backboard, so that the support shaft is able to secure and support the backboard so as to realize a horizontal-vertical switch.

In an example of the fixing support, the locating piece can further include a locating bead and a spring.

In an example of the fixing support, a lateral surface of an end, connected to the backboard, of the locating piece is provided with an opening, and the spring is inside the opening for ejecting the locating bead. For example, the backboard is provided with a concave for receiving the locating bead, and a size of the locating bead is equivalent to a size of the concave at the backboard.

In an example of the fixing support, the backboard is provided with a round hole, the locating piece is cooperatively arranged in the round hole, and the concave is provided at a side wall of the round hole.

In an example of the fixing support, an end, close to the backboard, of the locating piece is provided with one locating bead.

In an example of the fixing support, four concaves are provided, openings of the concaves are opposite to each other in pairs, and orientations of the openings of the concaves are perpendicular to the long side and the short side of the backboard respectively. Or, for example, two concaves are provided, and orientations of the openings of the concaves are perpendicular to the long side and the short side of the backboard respectively.

In an example of the fixing support, in a case that the locating bead is in the concave perpendicular to the long side, the fixing support is configured for horizontal-screen display; and in a case that the locating bead is in the concave perpendicular to the short side, the fixing support is configured for vertical-screen display.

In an example of the fixing support, an axial direction of the support shaft is at an angle of 45° from a plane of the backboard.

In an example of the fixing support, the locating piece is coupled with the support shaft.

In an example of the fixing support, the support shaft is made of a resiliently deformable rubber material.

In an example of the fixing support, an end, close to the backboard, of the locating piece has a sectional plane which is parallel with the backboard and comprises a three-quarter first sectional circular plane; an end, close to the locating piece, of the backboard is provided with a protruding column, and a sectional plane, parallel with the backboard, of the protruding column comprises a one-quarter second sectional circular plane; and a size of the first sectional circular plane matches a size of the second sectional circular plane, so as to prevent the locating piece from falling off the backboard.

In an example of the fixing support, the long side or the short side of the backboard is provided with a hanger for securing an object to be secured; or the long side and the short side of the backboard are provided with a hanger for securing an object to be secured. Or, the backboard is provided with a protruding frame for securing an object to be secured.

In an example of the fixing support, the backboard is provided with a round hole, the locating piece is cooperatively arranged in the round hole, and a side wall of the round hole is provided with an opening, inside which the spring is disposed for ejecting the locating bead. For example, the locating piece is provided with a concave for receiving the locating bead, and a size of the locating bead is equivalent to a size of the concave provided at the locating piece.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

REFERENCE NUMERALS

101—backboard; 101a—short side of the backboard; 101b—long side of the backboard; 101c—concave; 101d—column; 101e—one-quarter second sectional circular plane; 102—locating piece; 102a—opening; 102b—narrow neck; 102c—three-quarter first sectional circular plane; 103—support shaft; 104—locating bead; 105—spring; 106—hanger; 107—protruding frame.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

First Embodiment

Figure 1:
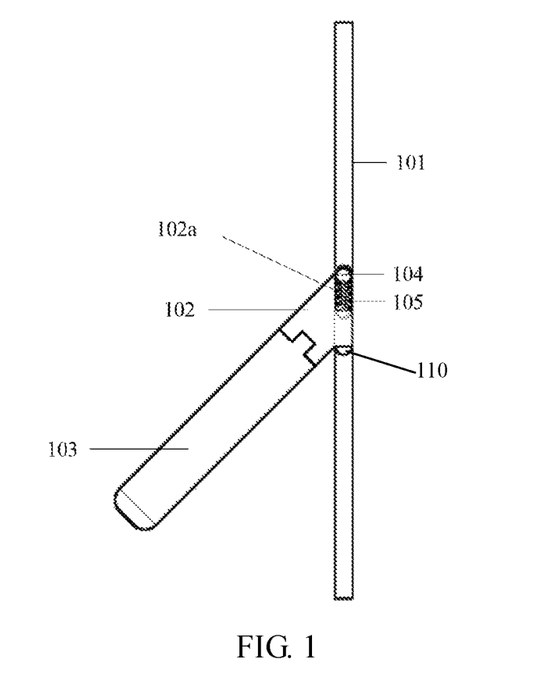
FIG. 1 is a side sectional view of a fixing support for horizontal and vertical use provided by one example of the embodiment of present disclosure.

As shown in FIG. 1, the fixing support for horizontal and vertical use provided by the embodiment of present disclosure includes a backboard 101, a locating piece 102 and a support shaft 103. The backboard 101 includes a backboard short side 101a and a backboard long side 101b, and the middle of the backboard 101 is provided with a round hole (e.g., a blind hole) 110 which matches the locating piece 102, the side wall of the round hole 110 of the backboard 101 is provided with concaves 101c; and the locating piece 102 includes a locating bead 104 and a spring 105, and the locating piece 102 is provided with an opening 102a.

The locating piece 102 is configured to connect the support shaft 103 and the backboard 101 and includes the locating bead 104 and the spring 105, and is configured to enable the support shaft 103 to secure and support the backboard 101 and to achieve a horizontal-vertical switch. The spring 105 is, for example, a spiral spring, and the locating bead is, for example, a steel ball.

A lateral surface of an end, close to the backboard 101, of the locating piece 102 is provided with an opening 102a, and the opening 102a is of a hole-shaped design, after installation, the spring 105 is disposed inside the hole of the opening 102a, and the locating bead 104 is configured to be ejected by the spring 105 (i.e., the spring 105 is in a compressed state so as to apply an force pushing outwards to the locating bead 104). For example, the opening diameter of the opening 102a may be set to be less than the diameter of the locating bead 104, so that the locating bead 104 is unlikely to be fully ejected from the inside of the hole of the opening 102a (see FIG. 6).

The backboard 101 is provided with the concave 101c. The inner lateral surface, corresponding to the round hole, of the columnar hole in the middle of the backboard 101 has the concave 101c. Specifically, for example, the size of the locating bead 104 may be equal to the size of the concave 101c, so as to maximize the degree of tightening of the locating piece 102 to the backboard 101.

Figure 2:
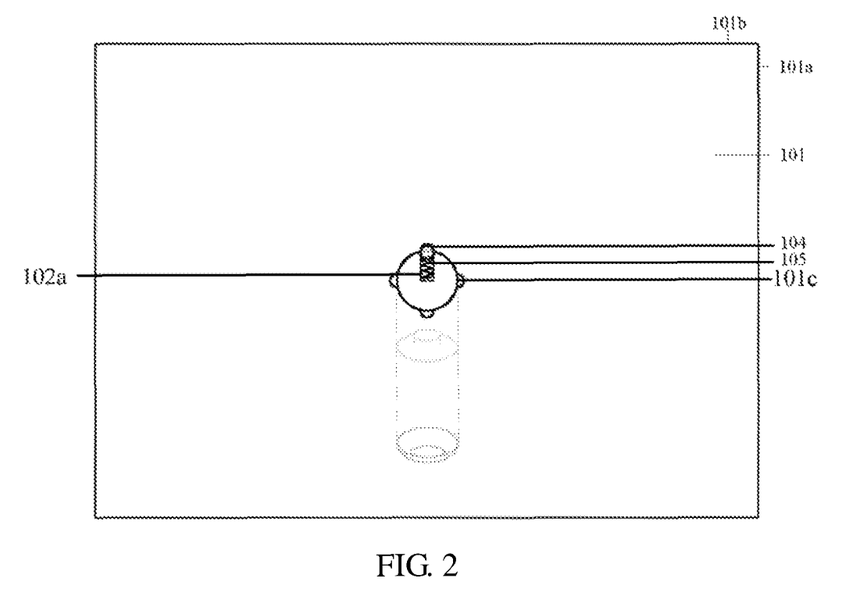
FIG. 2 is a front sectional view of a fixing support for horizontal and vertical use provided by one example of the embodiment of present disclosure.

For example, the number of the locating bead 104 provided at the end, close to the backboard 101, of the locating piece 102 may be one. And for example, the number of the concaves 101c is four, and the openings of the concaves 101c are opposite to each other in pairs, the orientations of the openings of the concaves 101c are perpendicular to the edge directions of the backboard 101 respectively. For example, again, the number of the concaves 101c is two, and the orientations of the openings of the concaves 101c are perpendicular to the long side direction and the short side direction of the backboard 101 respectively, in such a situation, it is still possible to achieve a horizontal-vertical switch. Assuming that the opening 102a of the locating piece 102 has an initial orientation perpendicular to the long side 101b of the backboard 101, as shown in FIG. 2, here due to the existence of a concave 101c, the locating bead 104 is in a released state under the action of the spring 105, and is ejected to fill the concave 101c so as to play a role of locating. When the locating piece 102 rotates taking the central line perpendicular to the round hole in the middle of the backboard 101 as its axis, the orientation of the opening 102a at the locating piece 102 varies. Due to the elasticity of the spring 105, the locating bead 104 is pressed by the inner lateral surface, corresponding to the round hole, of the columnar hole in the middle of the backboard 101, and is pressed into the opening 102a of the locating piece 102. Until the orientation of the opening 102a at the locating piece 102 is perpendicular to the short side 101a of the backboard 101, due to the existence of a concave 101c, the locating bead 104 is once more in a released state under the action of the spring 105, and is again ejected to fill into the concave 101c. Here the locating piece 102 is rotated with respect to the backboard 101 by an angle of 90°, thus completing the state change shown in FIG. 3, that is, from the (a) state where the long side 101b of the backboard is horizontal to the (b) state where the short side 101a of the backboard is horizontal, so that the backboard is changed from horizontal-screen display to vertical-screen display.

Still for example, in another example, a lateral surface of an end, close to the backboard 101, of the locating piece 102 is provided with an opening 102a, and the opening 102a is of a through-hole design and includes two locating beads. After installation, the spring 105 is disposed in the through hole of the opening 102a, the two locating beads are located respectively at both sides of the spring, and the locating beads 104 are ejected by the spring 105. For example, the opening diameter of the opening 102a may be set to be less than the diameter of the locating beads 104, so that the locating beads 104 are unlikely to be fully ejected from the inside of the hole of the opening 102a. The number of the concaves 101c is four, and the openings of the concaves 101c are opposite to each other in pairs, the orientations of the openings of the concaves 101c are perpendicular to the edge directions of the backboard 101 respectively. In this case, the two locating beads can be caught in two of the concaves 101c at the same time.

Figure 10:
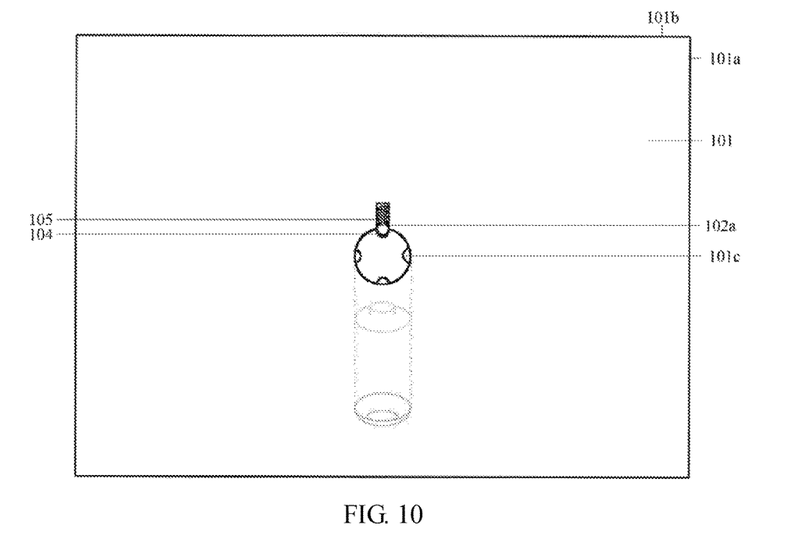
FIG. 10 is a front sectional view of a fixing support for horizontal and vertical use provided by another example of the embodiment of present disclosure.

Yet for example, in another example, as shown in FIG. 10, the side wall of the round hole of the backboard 101 is provided with holes, and the spring 105 is provided inside the hole, the locating bead 104 is ejected by the spring 105. For example, the opening diameter of the hole may be set to be less than the diameter of the locating bead 104, so that the locating bead is received in the hole and is not likely to be fully ejected from the inside of the hole; correspondingly, a lateral surface of an end, close to the backboard 101, of the locating piece may be provided with at least two concaves, the at least two concaves are at an angle of 90° with respect to the central axis of the locating piece. For example, when the locating piece is mounted into the round hole of the backboard, the locating bead may be ejected by the spring to fill into the concave at the lateral surface of the locating piece so as to play a role of locating. When the locating piece rotates in the round hole of the backboard, it is possible to achieve a horizontal-vertical switch.

Figure 3:
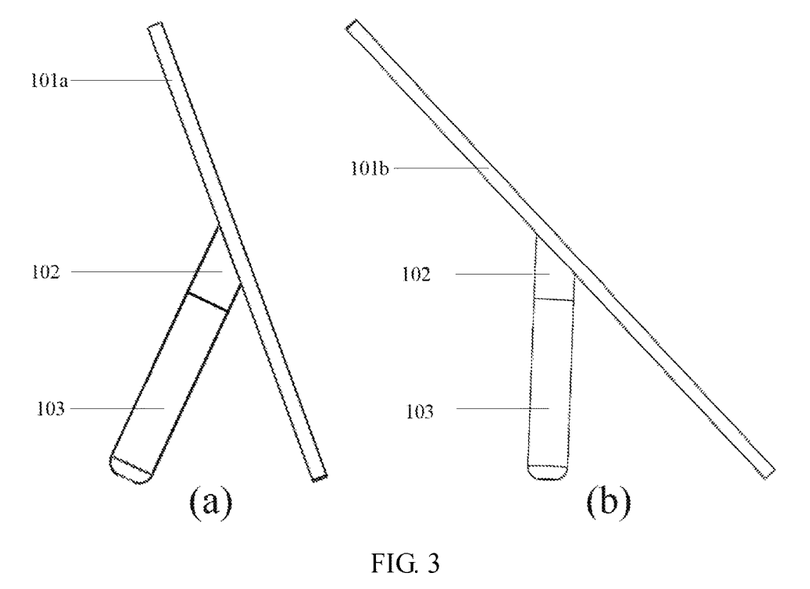
FIG. 3 is a side sectional view of a fixing support for horizontal (a) and vertical (b) stand provided by one example of the embodiment of present disclosure.

For example, an angle may be formed between the axial direction of the support shaft 103 and the plane of the backboard 101, and the angle is, for example, from 30° to 60°, for example, 45°, as shown in FIG. 3 (a) or 3(b).

For example, an end, away from the backboard 101, of the locating piece 102 may be provided with a protrusion or concave, such a protrusion or concave is correspondingly connected to the concave or protrusion provided at the support shaft 103 in a plug-in manner. As shown in FIG. 1, the locating piece 102 is provided with a concave, and the support shaft 103 is provided with a protrusion. Still for example, the locating piece 102 and the support shaft 103 may also be in a threaded connection or the like, and the embodiment of present disclosure is not limited to a specific connection manner.

For example, the support shaft 103 may be made of a resiliently deformable rubber material, or alternatively, may be made of plastic, wood, metal, or the like. In the case that the support shaft 103 is made of a rubber material, the support shaft, due to its nature similar to that of the plasticine, can arbitrarily change its shape, thus adjusting the orientation of the backboard 101, that is, the viewing angle of the backboard 101 with respect to a viewer, and this greatly facilitates the user's watching experience.

Second Embodiment

Figure 4:
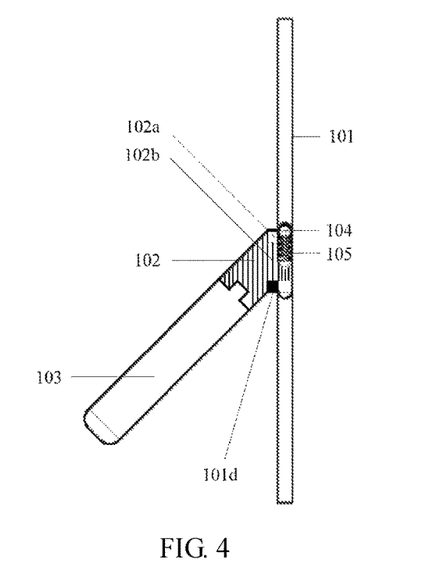
FIG. 4 is a side sectional view of a fixing support for horizontal and vertical use provided by one example of another embodiment of present disclosure.
Figure 5:
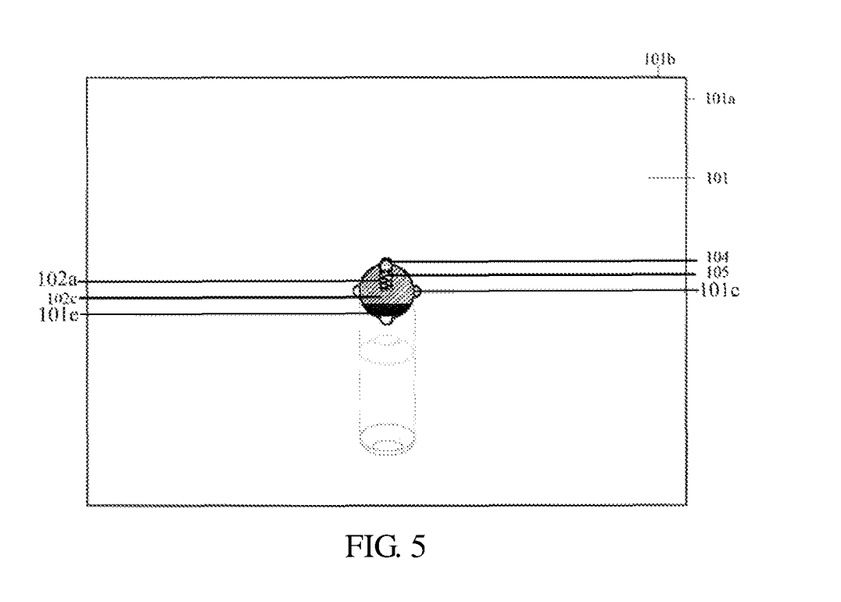
FIG. 5 is a front sectional view of a fixing support for horizontal and vertical use provided by one example of another embodiment of present disclosure.
Figure 6:
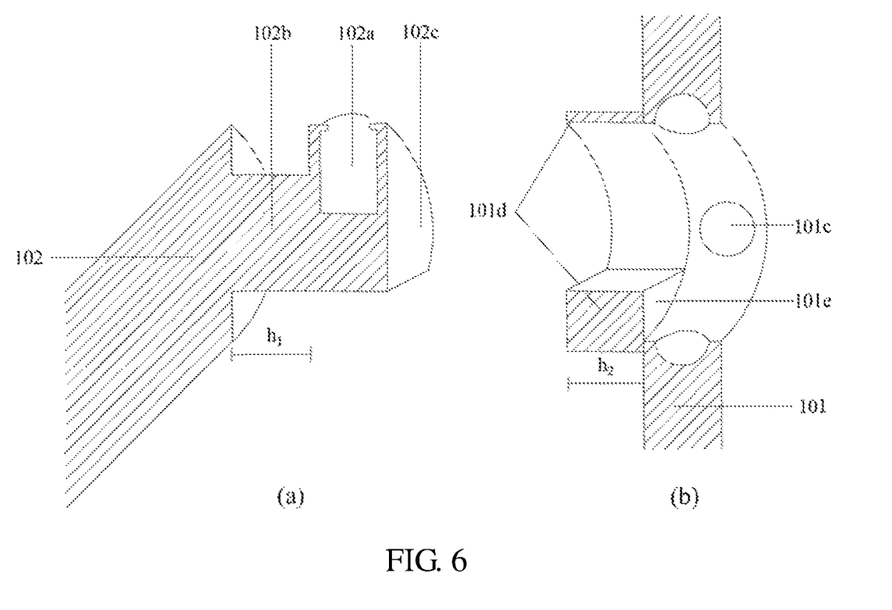
FIG. 6 is a partially enlarged solid sectional view of the fixing support, in a separated state, for horizontal (a) and vertical (b) use provided by another embodiment of the present disclosure.

In addition, another embodiment provided by the present disclosure is as shown in FIGS. 4, 5 and 6. FIG. 4 is a side sectional view of the fixing support for horizontal and vertical use, the reinforcing locating piece 102 includes the shaded portion in FIG. 4, and a locating bead 104 and a spring 105 which are embedded in the opening 102a.

An end, close to the backboard 101, of the locating piece 102 has a sectional plane parallel to the backboard 101, and the sectional plane is a three-quarter first sectional circular plane 102c, as shown by the shaded portion in FIG. 5 which is a front sectional view of the fixing support for horizontal and vertical use. Particularly, FIG. 6 is a partially enlarged solid sectional view of the fixing support for horizontal (a) and vertical (b) use, and in the case that the locating piece 102 is separated from the backboard 101, a solid part of the three-quarter first sectional circular plane 102c can be seen more clearly.

An end, close to the locating piece 102, of the backboard 101 is provided with a protruding column 101d (as shown in FIG. 4), the sectional plane of the protruding column 101d parallel with the backboard 101 is a one-quarter second sectional circular plane 101e (as shown in FIG. 5). A solid part of the one-quarter second sectional circular plane 101e can be seen more clearly from FIG. 6.

The specific locating process is described as follows.

Figure 7:
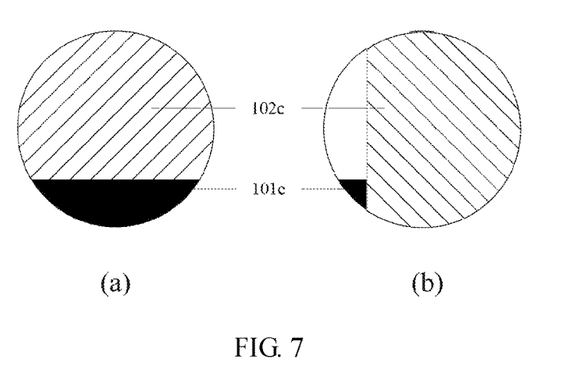
FIG. 7 is a front view of another embodiment of the present disclosure showing the relative position between the three-quarter first sectional circular plane of the locating piece and the one-quarter second sectional circular plane of the protruding column of the backboard.

Firstly, the size of the three-quarter first sectional circular plane 102c of the locating piece 102 matches the size of the one-quarter second sectional circular plane 101e of the backboard 101, so that the locating piece 102 is extended into the hollow protruding column 101d, which is the initial position, and the relative position between the first and second sectional circular planes can be seen in part (a) of FIG. 7.

Secondly, similar to the first embodiment, when the locating piece 102 rotates taking the central line perpendicular to the round hole in the middle of the backboard 101 as its axis, the orientation of the opening 102a at the locating piece 102 changes, and due to the existence of the narrow neck 102b, the rotation of the locating piece 102 is restricted by the protruding column 101d at the backboard 101. It should be noted that the length h1 of the narrow neck 102b is slightly less than or equal to the height h2 of the protruding column 101d when compared therebetween, as shown in FIG. 6.

Then the locating piece 102 rotates with respect to the backboard 101 until the orientation of the opening 102a at the locating piece 102 is perpendicular to the short side 101a of the backboard 101, due to the existence of the concaves 101c, the locating bead 104 is once more in a released state under the action of the spring 105, and is ejected again to fill into the concave 101c, at this point, the locating piece 102 rotates with respect to the backboard 101 by an angle of 90°, the relative position thereof can be seen in part (b) of FIG. 7, so that the backboard is switched from horizontal-screen display into vertical-screen display.

Third Embodiment

Figure 8:
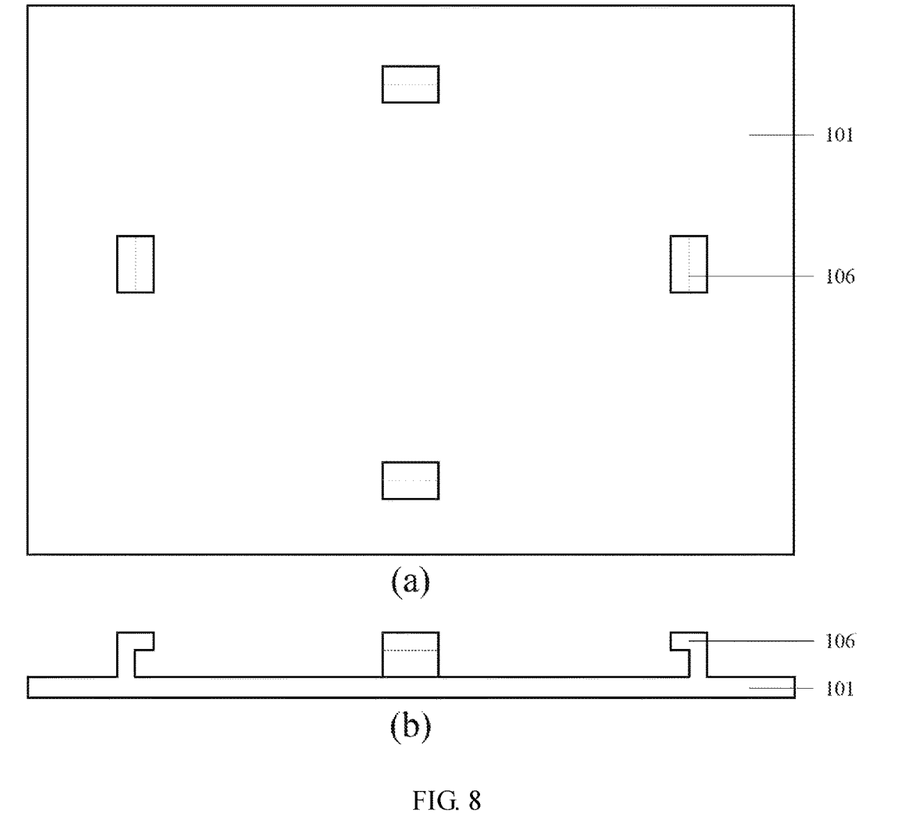
FIG. 8 illustrates the first securing manner at the front side of the backboard of the fixing support for horizontal and vertical use provided by another embodiment of the present disclosure.

In addition, the fixing support for horizontal and vertical use as described above may cooperatively secure the object to be secured at its front side. As shown in FIG. 8, the front side of the backboard 101 is provided with hangers 106 at locations respectively opposite to the long sides 101b and the short sides 101a, so as to secure an electronic product of a corresponding size, such as an electronic photo frame, a tablet PC, a cellphone or the like. Undoubtedly, the hangers 106 may also be provided at the long side 101b and the short side 101a of the backboard 101, or may also be provided at the long side 101b or the short side 101a, which will not be listed in detail.

Fourth Embodiment

Figure 9:
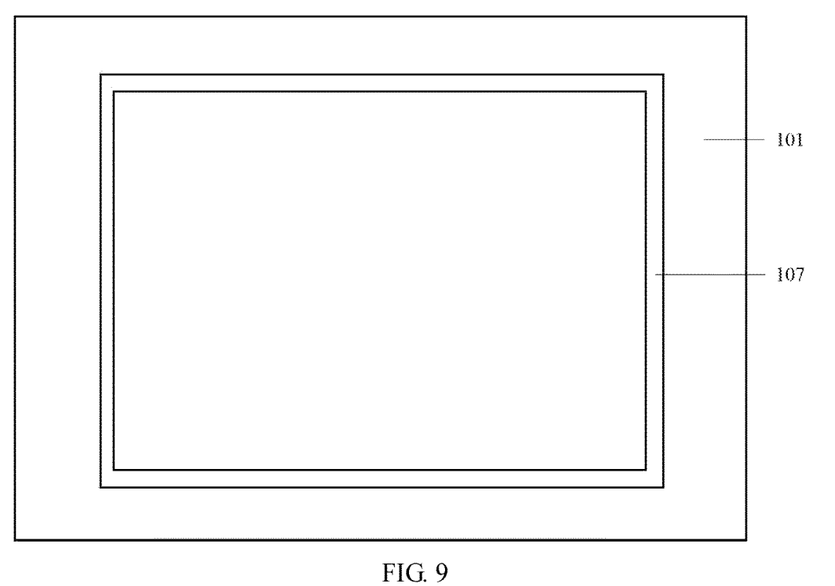
FIG. 9 illustrates the second securing manner at the front side of the backboard of the fixing support for horizontal and vertical use provided by another embodiment of the present disclosure.

In the fixing support for horizontal and vertical use as describe above, as shown in FIG. 9, the backboard 101 is provided with a protruding frame 107 for cooperatively securing an electronic product of a corresponding size at its front side.

What are described above is related to the illustrative embodiments of the disclosure only and not limitative to the scope of the disclosure; the scopes of the disclosure are defined by the accompanying claims.

This application claims the benefit of Chinese Patent Application No. 201610237224.3, filed on Apr. 15, 2016, which is hereby entirely incorporated by reference as a part of the present application.

What is claimed is:

1. A fixing support, comprising a backboard, a support shaft and a locating piece,
wherein the support shaft is configured to support the backboard, the backboard has a long side and a short side, and the locating piece is configured to connect the support shaft and the backboard, so that the support shaft is able to secure and support the backboard so as to realize a horizontal-vertical switch;
the locating piece comprises a locating bead and a spring;
a lateral surface of an end, connected to the backboard, of the locating piece is provided with an opening, and the spring is inside the opening for electing the locating bead; and
the backboard is provided with a plurality of concaves for receiving the locating bead, and a size of the locating bead is equivalent to a size of the each concave at the backboard.

2. The fixing support according to claim 1, wherein the backboard is provided with a round hole, the locating piece is cooperatively arranged in the round hole, and at least one of the concaves is provided at a side wall of the round hole.

3. The fixing support according to claim 1, wherein four concaves are provided, openings of the four concaves are opposite to each other in pairs, and orientations of the openings of the four concaves are perpendicular to the long side and the short side of the backboard respectively.

4. The fixing support according to claim 1, wherein two concaves are provided, and orientations of the openings of the two concaves are perpendicular to the long side and the short side of the backboard respectively.

5. The fixing support according to claim 1, wherein in a case that the locating bead is in at least one of the concaves which is perpendicular to the long side, the fixing support is configured for horizontal-screen display; and in a case that the locating bead is in at least one of the concaves which is perpendicular to the short side, the fixing support is configured for vertical-screen display.

6. The fixing support according to claim 1, wherein an axial direction of the support shaft is at an angle of 30° to 60° from a plane of the backboard.

7. The fixing support according to claim 6, wherein the locating piece is coupled with the support shaft.

8. The fixing support according to claim 1, wherein the support shaft is made of a resiliently deformable rubber material.

9. A fixing support, comprising a backboard, a support shaft and a locating piece, wherein:
the support shaft is configured to support the backboard, the backboard has a long side and a short side, and the locating piece is configured to connect the support shaft and the backboard, so that the support shaft is able to secure and support the backboard so as to realize a horizontal-vertical switch;
an end, close to the backboard, of the locating piece has a sectional plane which is parallel with the backboard and comprises a three-quarter first sectional circular plane; an end, close to the locating piece, of the backboard is provided with a protruding column, and a sectional plane, parallel with the backboard, of the protruding column comprises a one-quarter second sectional circular plane; and a size of the first sectional circular plane matches a size of the second sectional circular plane, so as to prevent the locating piece from falling off the backboard.

10. The fixing support according to claim 9, wherein the long side or the short side of the backboard is provided with a hanger for securing an object to be secured; or the long side and the short side of the backboard are provided with a hanger for securing an object to be secured.

11. The fixing support according to claim 9, wherein the backboard is provided with a protruding frame for securing an object to be secured.

12. The fixing support according to claim 9, wherein: the locating piece comprises a locating bead and a spring.

13. The fixing support according to claim 9, wherein:
the locating piece comprises a locating bead and a spring; and
a lateral surface of an end, connected to the backboard, of the locating piece is provided with an opening, and the spring is inside the opening for electing the locating bead.

14. The fixing support according to claim 9, wherein:
the locating piece comprises a locating bead and a spring;
a lateral surface of an end, connected to the backboard, of the locating piece is provided with an opening, and the spring is inside the opening for electing the locating bead; and
the backboard is provided with a concave for receiving the locating bead, and a size of the locating bead is equivalent to a size of the concave at the backboard.

15. The fixing support according to claim 9, wherein:
the locating piece comprises a locating bead and a spring;
a lateral surface of an end, connected to the backboard, of the locating piece is provided with an opening, and the spring is inside the opening for electing the locating bead; and
the backboard is provided with a concave for receiving the locating bead, and a size of the locating bead is equivalent to a size of the concave at the backboard; and
the backboard is provided with a round hole, the locating piece is cooperatively arranged in the round hole, and the concave is provided at a side wall of the round hole.

16. A fixing support, comprising a backboard, a support shaft and a locating piece, wherein
the support shaft is configured to support the backboard, the backboard has a long side and a short side, and the locating piece is configured to connect the support shaft and the backboard, so that the support shaft is able to secure and support the backboard so as to realize a horizontal-vertical switch;
the locating piece comprises a locating bead and a spring;
the backboard is provided with a round hole, the locating piece is cooperatively arranged in the round hole, and a side wall of the round hole is provided with an opening, inside which the spring is disposed for ejecting the locating bead.

17. The fixing support according to claim 16, wherein the locating piece is provided with a concave for receiving the locating bead, and a size of the locating bead is equivalent to a size of the concave provided at the locating piece.

\* \* \* \* \*